(12) United States Patent
Sugawara et al.

(10) Patent No.: US 8,094,463 B2
(45) Date of Patent: Jan. 10, 2012

(54) CRYSTAL OSCILLATOR FOR SURFACE MOUNTING

(75) Inventors: Kenichi Sugawara, Saitama (JP); Manabu Ito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 36 days.

(21) Appl. No.: 12/778,535

(22) Filed: May 12, 2010

(65) Prior Publication Data

US 2010/0290206 A1  Nov. 18, 2010

(30) Foreign Application Priority Data

May 14, 2009 (JP) ................. 2009-117528

(51) Int. Cl.
*H05K 7/02* (2006.01)

(52) U.S. Cl. ...................................... 361/808

(58) Field of Classification Search .......... 361/807, 361/808, 767, 760, 736; 257/678; 310/348; 331/68

See application file for complete search history.

(56) References Cited

U.S. PATENT DOCUMENTS

| | | | |
|---|---|---|---|
| 6,833,768 B2 * | 12/2004 | Harima et al. | 331/158 |
| 7,973,610 B2 * | 7/2011 | Moriya et al. | 331/68 |
| 8,031,013 B2 * | 10/2011 | Takeuchi et al. | 331/68 |
| 2009/0021315 A1 | 1/2009 | Harima | |

FOREIGN PATENT DOCUMENTS

| | | |
|---|---|---|
| JP | 2007-081219 A | 3/2007 |
| JP | 2009-027469 A | 2/2009 |

* cited by examiner

*Primary Examiner* — Dameon Levi

(74) *Attorney, Agent, or Firm* — Carrier Blackman & Associates, P.C.; Joseph P. Carrier; William D. Blackman

(57) ABSTRACT

A crystal oscillator for surface mounting comprising: a case main body including concave portions on both principal surfaces; a crystal element hermetically encapsulated in one concave portion; an IC chip housed in the other concave portion; mounting terminals provided on four corner portions of an opening end face of the other concave portion; and a protrusion serving as identifying marks along a direction of sides of the case main body and provided in some of the mounting terminals. The mounting terminals, to which the protrusions are provided, are provided on both corner portions on one end side of the case main body. The protrusions extend in a same direction from the mounting terminals at an inner or outer circumference side of the opening end face. The mounting terminals including the protrusions are symmetric with respect to a center line between both corner portions on the one end side.

2 Claims, 4 Drawing Sheets

{Fig. 1a}
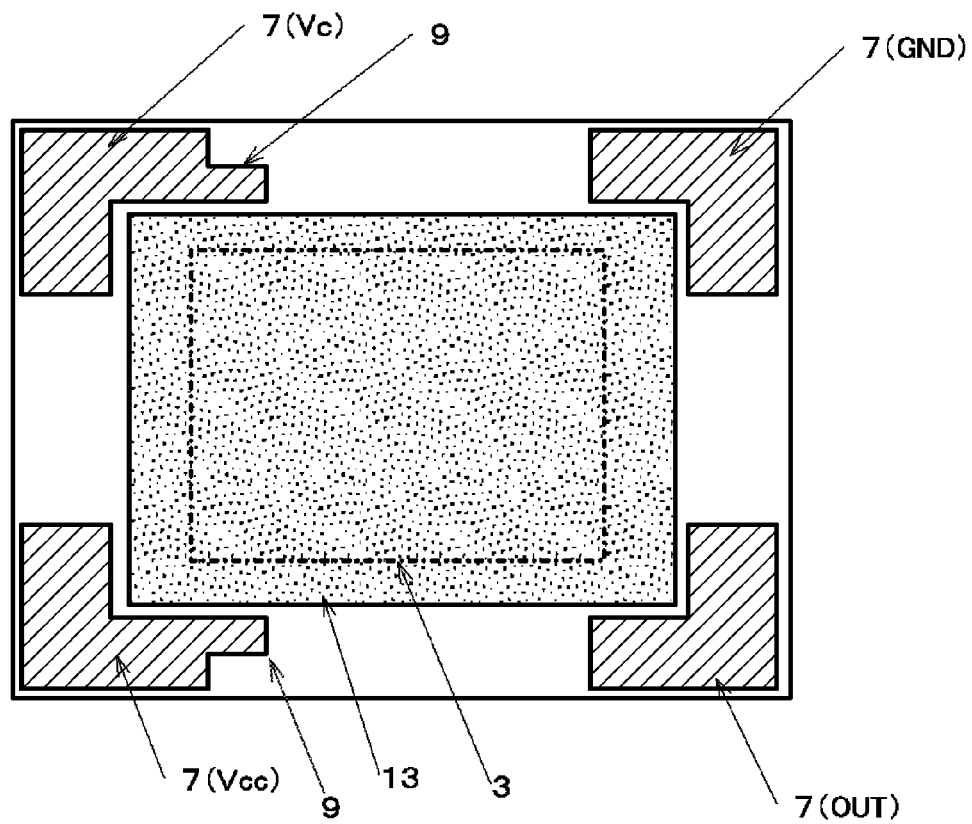
{Fig. 1b}
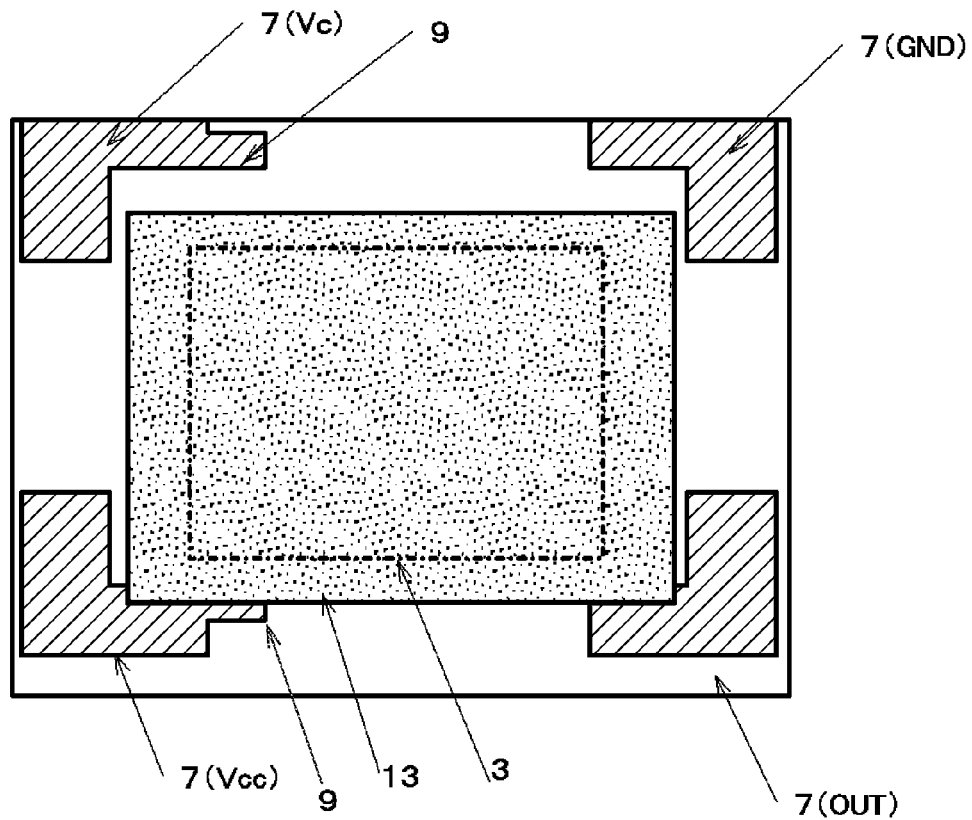

{Fig. 2}
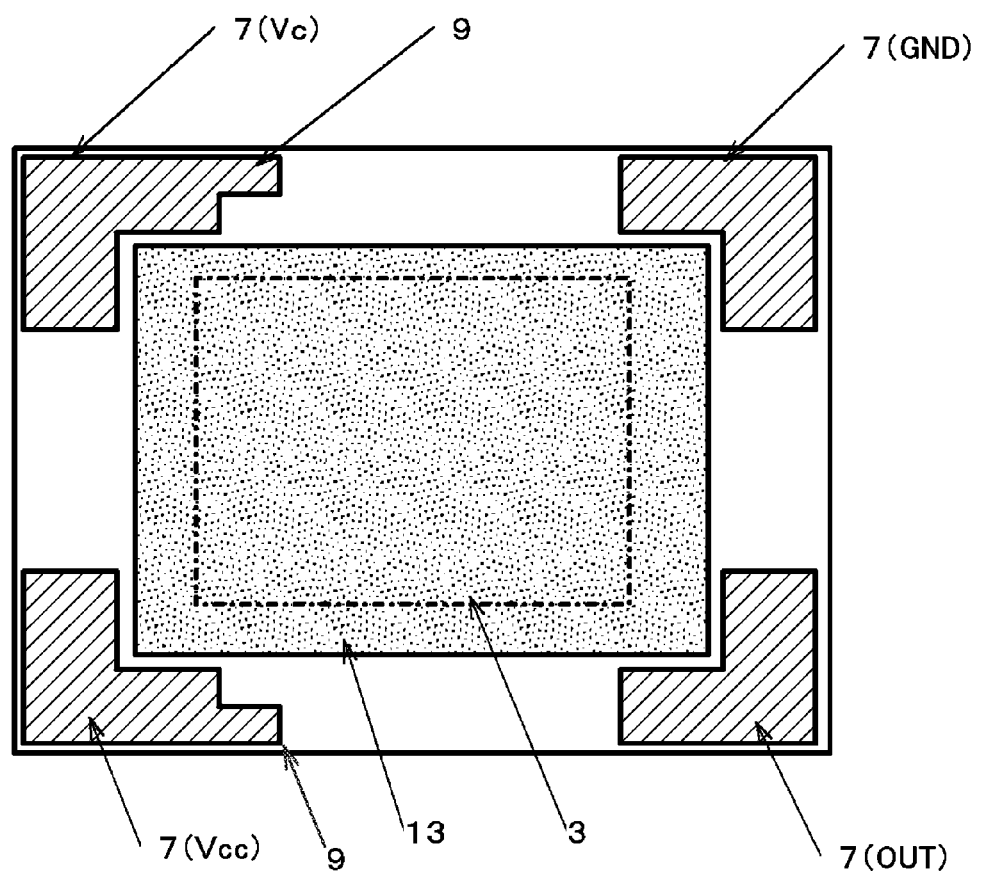

{Fig. 3}
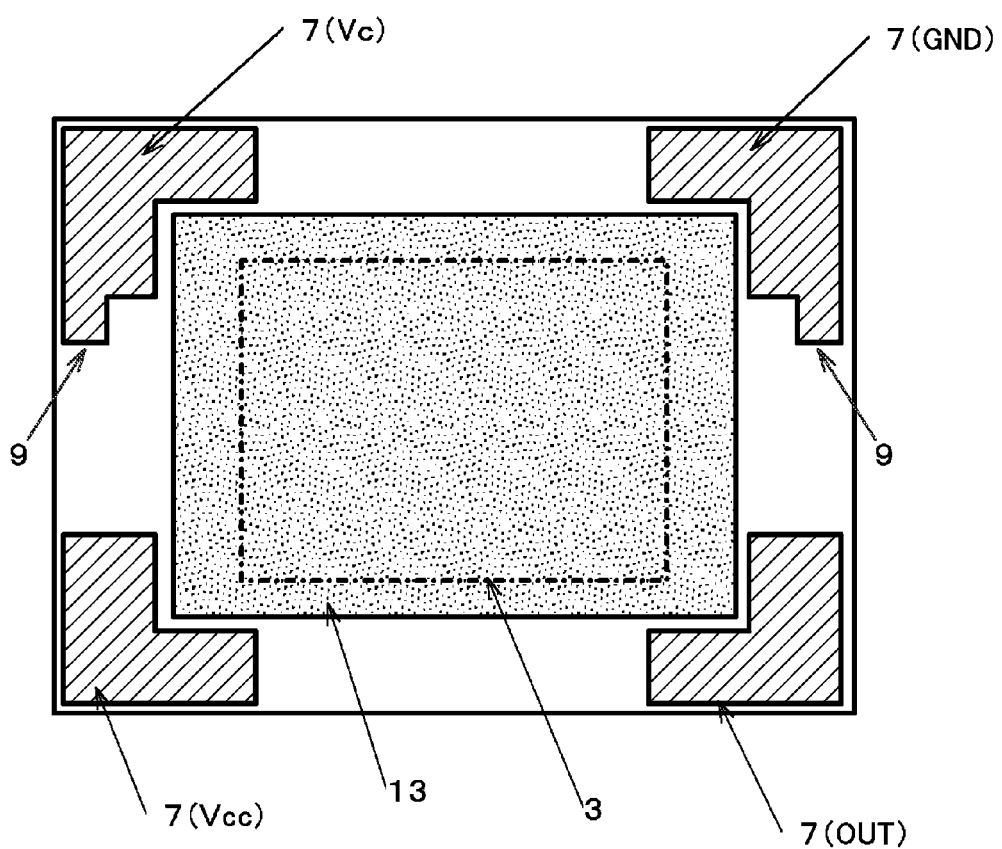

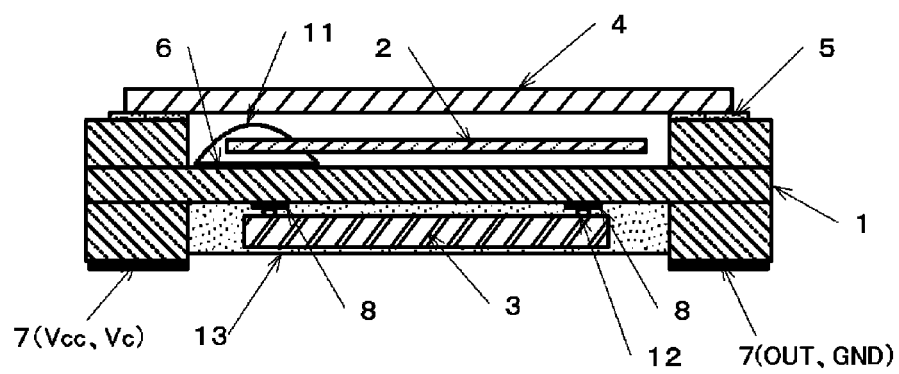
{Fig. 4a}
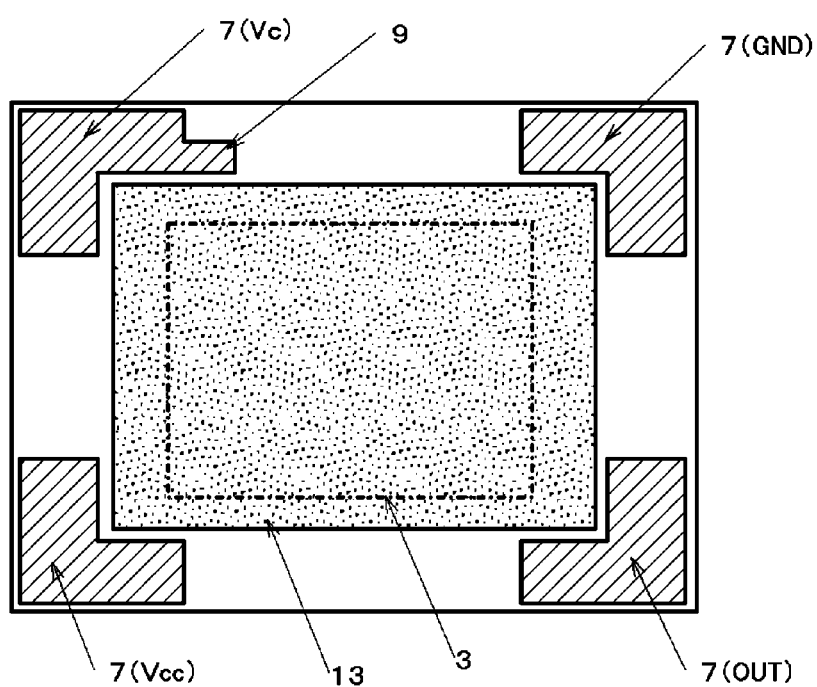
{Fig. 4b}
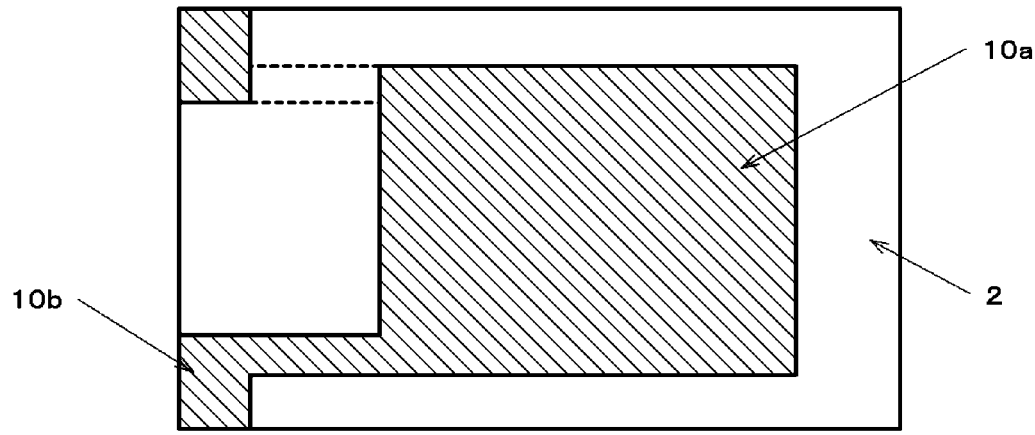
{Fig. 4c}

CRYSTAL OSCILLATOR FOR SURFACE MOUNTING

TECHNICAL FIELD

The present invention relates to a technical field of a crystal oscillator for surface mounting which is made into an H structure type (hereinafter referred to as a surface-mounted oscillator), and in particular, to an identifying mark for recognizing and matching directionality of a surface-mounted oscillator.

BACKGROUND ART

Surface-mounted oscillators are compact and lightweight. Therefore, the surface-mounted oscillators are built into portable type electronics such as mobile phones, for example, as frequency and time reference sources. As one of such surface-mounted oscillators, there has been proposed a surface-mounted oscillator (an H structure type), in which a case main body includes concave portions on both principal surfaces thereof, and a crystal element is housed in one concave portion and an IC chip is housed in the other concave portion, for example.

FIGS. 4a and 4b are diagrams for explanation of a related-art surface-mounted oscillator, in which FIG. 4a is a cross-sectional view thereof, FIG. 4b is an outer bottom view thereof, and FIG. 4c is a plan view of a crystal element of the related-art surface-mounted oscillator (see, for example, PTL 1).

The surface-mounted oscillator includes a case main body 1, which is formed into an H shape in cross section having concave portions on both principal surfaces thereof, and which is formed into a rectangular shape in a plan view. The surface-mounted oscillator is configured such that a crystal element 2 and an IC chip 3 are housed in the case main body 1, and at least the crystal element 2 is hermetically encapsulated with a metal cover 4. The case main body 1 is made of laminar ceramics, for example, and includes a central bottom wall and upper and lower frame walls forming the concave portions on both principal surfaces thereof. A metal ring 5 is provided on the top surface (opening end face) of the upper frame wall that is one concave portion of the case main body 1. A crystal holding terminal 6 is provided on the inner bottom face of the one concave portion of the case main body 1.

Mounting terminals 7, which are formed into hook shapes striding over the adjacent sides at right angles, for example, are provided on the four corner portions of the lower surface (outer bottom face) of the lower frame wall which is the other concave portion of the case main body 1. Circuit terminals 8 are provided on an inner bottom face of the other concave portion of the case main body 1. With respect to the mounting terminals 7, the positions on the four corner portions are usually standardized, and for example, a power source terminal 7(Vcc), an output terminal 7(OUT), a ground terminal 7(GND), and a voltage control terminal 7 (Vc) are arranged on the four corner portions in this order counterclockwise beginning at the diagonally lower left position, for example.

The respective mounting terminals 7 (Vcc), 7 (OUT), 7 (GND), 7 (Vc) are electrically connected to respective circuit terminals 8 on the inner bottom face of the other concave portion of the case main body 1 through wiring paths (not shown). Then, a protrusion 9 is provided so as to be along the direction of long sides of the case main body 1, for example, to the voltage control terminal 7(Vc) differently from the other mounting terminals 7(Vcc), 7(OUT), 7(GND), and the positions and directionality (length direction) of the respective mounting terminals 7 (Vcc), 7(OUT), 7(GND), 7(Vc) are specified by use of the protrusion 9 as an identifying mark.

The crystal element 2 includes excitation electrodes 10a on both principal surfaces thereof, and leading electrodes 10b are respectively extended out so as to be folded to the opposite surface on both sides of one ends. Both sides of the crystal element 2 where the leading electrodes 10b are extended are firmly fixed to the crystal holding terminal 6, which is provided on the inner bottom face of the one concave portion of the case main body 1, with an electrically conductive adhesive 11. The crystal holding terminal 6 is connected to the circuit terminals 8 (crystal terminals) in the other concave portion of the case main body 1 through wiring paths (not shown). Then, the metal cover 4 is bonded to the metal ring 5 provided on the opening end face of the one concave portion of the case main body 1 by seam welding, to hermetically encapsulate the crystal element 2.

The IC chip 3, in which at least oscillator circuits (not shown) are integrated, includes an IC terminal (not shown) on its principal surface serving as a circuit forming surface. Then, the IC chip 3 is firmly fixed to the circuit terminals 8 in the other concave portion of the case main body 1 with ultrasound thermal compression bonding by use of bumps 12, for example, to be electrically and mechanically connected to the circuit terminals 8. Usually, resin 13 (so-called underfill) for specifically protecting the circuit forming surface is injected to the other concave portion of the case main body 1 and is applied so as to cover the IC chip 3.

In such an surface-mounted oscillator, for example, in the process for manufacturing including an inspection process for an oscillation characteristic of the surface-mounted oscillator, the protrusion 9 of the voltage control terminal 7 (Vc) as an identifying mark is recognized by image processing. Then, it is judged whether the directionality in a length direction of the surface-mounted oscillator is correct or not, and the surface-mounted oscillator is conveyed to the following process. In this case, since the surface-mounted oscillator (case main body 1) has a rectangular shape in a plan view, the position of the voltage control terminal 7 (Vc) having the protrusion 9 serving as an identifying mark is on the diagonally upper left side or diagonally lower right side. Then, in the case where the voltage control terminal 7 (Vc) serving as an identifying mark is on the diagonally upper left side, it is judged as "correct," and the surface-mounted oscillator remains as is conveyed to the following process. Further, in the case where the voltage control terminal 7 (Vc) having the protrusion 9 serving as an identifying mark is on the diagonally lower right side, it is judged as "incorrect," and the surface-mounted oscillator (case main body 1) is inverted to be conveyed to the following process.

{Citation List}
{Patent Literature}
  (PTL 1)JP-A-2009-27469

SUMMARY OF THE INVENTION

Technical Problem

However, in the surface-mounted oscillator having the above-described configuration, when a size of the surface-mounted oscillator is downsized to be 2.0×1.6 mm or less, the frame width for forming the other concave portion of the case main body 1 is narrowed to reduce the mounting terminals 7 as well in size. Accordingly, the protrusion 9 provided on the voltage control terminal 7(Vc) serving as an identifying mark as well is reduced in size. Then, it becomes difficult to recognize the protrusion 9 serving as an identifying mark due to displacement at the time of forming the base electrodes of the respective mounting terminals 7 by use of a mask by printing, for example.

In this case, in the case where the identifying mark (the protrusion 9) is not recognized, the surface-mounted oscillator is eliminated from the recognition process, and is confirmed by a direct visual check by a worker, for example, and the surface-mounted oscillator is sent to the following process when it is judged as a correct direction, for example. Further, when the surface-mounted oscillator is inspected directly when the positions of the mounting terminals 7 are inverted in the inspection process, for example, it is impossible to measure its oscillation characteristic, and the surface-mounted oscillator is processed as a defective. For these reasons, there has been the problem that an identifying mark which is unrecognizable worsens the productivity thereof.

An object of the present invention is to provide a surface-mounted oscillator in which an identifying mark which is reliably recognizable is provided on a mounting terminal, to improve the productivity thereof.

Solution to Problem

According to a first aspect of the invention, there is provided a crystal oscillator for surface mounting comprising: a case main body, which includes concave portions on both principal surfaces thereof, and which is formed into a rectangular shape in a plan view; a crystal element that is hermetically encapsulated in one concave portion of the case main body; an IC chip that is housed in the other concave portion of the case main body; mounting terminals provided on four corner portions of an opening end face that is an outer bottom face of the other concave portion; and a protrusion, which serves as identifying marks along a direction of sides of the case main body, and which is provided in some of the mounting terminals, wherein the mounting terminals, to which the protrusions are provided, are provided on both corner portions on one end side of the case main body, wherein the protrusions extend in a same direction from the mounting terminals, which are provided on the corner portions, at an inner circumference side or an outer circumference side of the opening end face, and wherein the mounting terminals, to which the protrusions are provided, are symmetric with respect to a center line between both corner portions on the one end side.

ADVANTAGEOUS EFFECTS OF THE INVENTION

According to such a configuration, for example, even when the mounting terminals by printing are formed so as to be displaced in a direction of a straight line connecting both corner portions on one end, it is possible to recognize an identifying mark of one of the mounting terminals. Accordingly, it is possible to reliably recognize an identifying mark of the surface-mounted oscillator, which makes it possible to improve the productivity thereof.

According to a second aspect of the invention, in the crystal oscillator for surface mounting, wherein the mounting terminals are formed into hook shapes on adjacent sides at right angles on the four corner portions of the opening end face that is the outer bottom face. According to the second aspect, the shapes of the mounting terminals are clarified, and a mounting area when the planar outline of the surface-mounted oscillator is reduced in size is increased, to improve its bonding strength.

BRIEF DESCRIPTION OF THE DRAWINGS

FIGS. 1a and 1b are outer bottom views of a surface-mounted oscillator for explanation of one embodiment of the present invention;

FIG. 2 is an outer bottom view of the surface-mounted oscillator for explanation of another embodiment of the present invention;

FIG. 3 is an outer bottom view of the surface-mounted oscillator for explanation of still another embodiment of the present invention; and FIGS. 4a to 4c are diagrams for explanation of one example of a related-art surface-mounted oscillator, in which FIG. 4a is a cross-sectional view thereof, FIG. 4b is an outer bottom view thereof, and FIG. 4c is a plan view of a crystal element of the related-art surface-mounted oscillator.

DESCRIPTION OF EMBODIMENTS

Hereinafter, one embodiment of the present invention will be described with reference to FIG. 1a (outer bottom views of a surface-mounted oscillator). Incidentally, portions which are the same as those in the related-art surface-mounted oscillator are denoted by the same numbers, and descriptions thereof will be simplified or omitted.

The surface-mounted oscillator includes a case main body 1, which is made of laminar ceramics, and which is formed to have an H structure having concave portions on both principal surfaces thereof as described above. The surface-mounted oscillator is configured such that a crystal element 2 is housed in one concave portion of the case main body 1 and is hermetically encapsulated with a metal cover 4. Then, the surface-mounted oscillator is configured such that an IC chip 3 is housed in the other concave portion of the case main body 1. Hook-shaped mounting terminals 7 are provided on four corner portions of the opening end face, which is an outer bottom face, of the other concave portion of the case main body 1. Underfill is provided to the other concave portion of the case main body 1 (refer to FIG. 4a).

In this embodiment, among the mounting terminals 7 (Vcc), 7 (OUT), 7 (GND), 7 (Vc) which are formed into hook shapes on the four corner portions provided on the outer bottom face of the case main body 1, protrusions 9 serving as identifying marks are provided on the voltage control terminal 7 (Vc) and the power source terminal 7 (Vcc) which are on both corner portions on one end side in the direction of the long sides of the case main body 1. In this example, the protrusions 9 are formed along the direction of one set of the long sides facing each other and are respectively formed on the inner circumference sides of the outer circumferential surface (the opening end face) of the case main body 1. In other words, the protrusions 9 extend in the same direction from the mounting terminals 7 at the inner circumference sides of the outer circumferential surface (the opening end face) of the case main body 1.

With this configuration, the mounting terminals 7 (voltage control terminal 7 (Vc) and power source terminal 7 (Vcc)), to which the protrusions 9 serving as identifying marks are provided, are made symmetric with respect to a center line intermediate between both corner portions on the one end side (i.e., the center line dividing the width direction into two equal parts) of the outer bottom face of the case main body 1. Then, the quadrangular ceramic base material is exposed in the voltage control terminal 7 (Vc) and power source terminal 7 (Vcc) on the outer circumference side of the case main body 1 due to the protrusions 9, to form contours due to metal films (Au) formed into L shapes.

These mounting terminals 7 (Vcc), 7 (OUT), 7 (GND), 7 (Vc) are formed by printing using a mask with their base electrodes made of W (tungsten) or Mo (molybdenum) in a state of a ceramic sheet in the same way as in the related-art surface-mounted oscillator. Then, ceramic sheets other than this ceramic sheet for forming the case main body 1 are laminated to perform firing thereof. Thereafter, Ni and Au are formed in series on the base electrodes exposed on the surface of the laminated ceramic sheets by electroplating, for example.

In such a surface-mounted oscillator, for example, in the inspection process after the completion of the surface-mounted oscillator, probes from measuring instruments (not shown) are brought into contact with the mounting terminals 7 (Vcc), 7 (OUT), 7 (GND), 7 (Vc) on the four corner portions of the outer bottom face of the surface-mounted oscillator to inspect an oscillation characteristic of the surface-mounted oscillator. Here, for example, when the voltage control terminal 7 (Vc) and the power source terminal 7 (Vcc) on the one end side of the surface-mounted oscillator are located on the left side of a jig, the probes corresponding to the respective mounting terminals 7 (Vcc), 7 (OUT), 7 (GND), 7 (Vc) are brought into contact with them, to measure the oscillation characteristic of the surface-mounted oscillator correctly.

Accordingly, in the case where the length direction of the surface-mounted oscillator formed into a rectangle is reversed (inverted), that is, in the case where the ground terminal 7 (GND) and the output terminal (OUT) on the other end side of the surface-mounted oscillator are located on the left side of the jig, it is impossible to inspect its oscillation characteristic correctly, and it is judged as unsatisfactory specifications and the surface-mounted oscillator is considered as a defective. For this reason, it is necessary to reliably detect the identifying marks to judge whether the positions and directionality of the mounting terminals 7 (Vcc), 7 (OUT), 7 (GND), 7 (Vc) are correct or not before a surface-mounted oscillator is housed in the jig.

For example, first, a surface-mounted oscillator is conveyed onto a directionality inspection table so as to bring its length direction into line in one direction before the inspection process for an oscillation characteristic. In this case, because the surface-mounted oscillator (case main body 1) is a rectangle, the one end side of the voltage control terminal 7 (Vc) and the power source terminal 7 (Vcc), to which the identifying marks (the protrusions 9) are provided, is located on the left side or located on the right side on the directionality inspection table (not shown).

Next, a camera for image processing recognizes the mounting terminals 7 at two places which are both corner portions on the left side of the surface-mounted oscillator brought into line on the directionality inspection table. In this case, it is assumed that, for example, the mounting terminals 7 at the two places on the left side are the voltage control terminal 7 (Vc) and the power source terminal 7 (Vcc) to which the identifying marks (the protrusions 9) are provided. Then, it is assumed that, for example, the respective mounting terminals 7 (Vcc), 7 (OUT), 7 (GND), 7 (Vc) are displaced in a direction perpendicular to the long sides (for example, in the upper side direction) of FIG. 1) of the surface-mounted oscillator (case main body 1) due to displacement of the mask for the base electrodes or the like (FIG. 1*b*).

Here, the protrusions 9 serving as identifying marks are provided on the voltage control terminal 7 (Vc) and the power source terminal 7 (Vcc) on the outer circumference side of the opening end face along the set of the long sides facing each other on the outer bottom face of the surface-mounted oscillator (case main body 1) as described above. Accordingly, the quadrangular ceramic base material of the opening end face due to the identifying mark (the protrusion 9) of the voltage control terminal 7 (Vc) on the outer bottom face of the surface-mounted oscillator (case main body 1) in the upper side is reduced in size. Thus, it becomes difficult to recognize the contour formed into an L shape. Accordingly, as a recognized result of a computer by image processing, it is judged that "there is no" identifying mark by the voltage control terminal 7 (Vc).

In contrast, the quadrangular ceramic base material due to the identifying mark (the protrusion 9) of the power source terminal 7 (Vcc) on the outer bottom face of the surface-mounted oscillator (case main body 1) in the lower side is completely exposed. Thus, it is easy to recognize the contour formed into an L shape. Accordingly, as a recognized result of the computer, it is judged that "there is" an identifying mark by the power source terminal 7 (Vcc). As a result, it is judged that the directionality is correct on the basis of the recognition of the identifying mark provided on the power source terminal 7 (Vcc). Then, the surface-mounted oscillator is transferred as it is to the inspection process for an oscillation characteristic.

Next, when it is assumed that the mounting terminals 7 at the two places on the left side of the directionality inspection table are the ground terminal 7 (GND) and the output terminal 7 (OUT) having the usual shapes (hook shapes), both are not recognized as a contour formed into an L shape. Accordingly, the computer judges that the directionality of the surface-mounted oscillator is reversed (inverted) by image processing. Thereby, the surface-mounted oscillator is inversed to be transferred to the inspection process for an oscillation characteristic.

From these facts, in the present embodiment, even when there is displacement of the mounting terminals 7 caused by the printing mask, for example, it is possible to reliably recognize its directionality by virtue of the protrusions 9 of the voltage control terminal 7 (Vc) and power source terminal 7 (Vcc) serving as identifying marks provided on both corner portions on the one end side in the direction of the long sides of the case main body of the surface-mounted oscillator. Accordingly, it is possible to prevent false recognition that it is judged as a defect in oscillation in a manual recognition process or a manual inspection process, to improve the productivity thereof.

In the above-described embodiment, the protrusions 9 of the voltage control terminal 7 (Vc) and power source terminal 7 (Vcc) serving as identifying marks are both formed on the inner circumference side of the outer circumference surface of the case main body 1 to form the L-shaped contours on the outer circumference side of the outer circumference surface of the case main body 1. However, in contrast thereto, the protrusions 9 of the voltage control terminal 7 (Vc) and power source terminal 7 (Vcc) may be both formed on the outer circumference side of the outer circumference surface of the case main body 1 to form the L-shaped contours on the inner circumference side of the outer circumference surface of the case main body 1 (FIG. 2). Further, the protrusions 9 are provided in the direction of the long sides of the case main body 1. However, even when the protrusions 9 are provided in the direction of the short sides of the case main body 1 as shown n FIG. 3, the same effects can be obtained. Then, the surface-mounted oscillator is made into an H structured type. However, for example, the case where a concave mounting substrate in which the IC chip 3 is housed is bonded to the bottom face of a crystal unit is also included in the H structured type (so-called junction type) (not shown).

REFERENCE SIGN LIST

1 ... Case main body, 2 ... Crystal element, 3 ... IC chip, Metal cover, 5 ... Metal ring, 6 ... Crystal holding terminal, 7 ... Mounting terminal, 8 ... Circuit terminal, 9 ... Protrusion, 10 ... Excitation and leading electrodes, 11 ... Electrically conductive adhesive, 12 ... Bump, 13 ... Resin

The invention claimed is:

1. A crystal oscillator for surface mounting comprising:
a case main body, which includes concave portions on both principal surfaces thereof, and which is formed into a rectangular shape in a plan view;
a crystal element that is hermetically encapsulated in one concave portion of the case main body;
an IC chip that is housed in the other concave portion of the case main body;
mounting terminals provided on four corner portions of an opening end face that is an outer bottom face of the other concave portion; and
a protrusion, which serves as identifying marks along a direction of sides of the case main body, and which is provided in some of the mounting terminals,
wherein the mounting terminals, to which the protrusions are provided, are provided on both corner portions on one end side of the case main body,
wherein the protrusions extend in a same direction from the mounting terminals, which are provided on the corner portions, at an inner circumference side or an outer circumference side of the opening end face, and
wherein the mounting terminals, to which the protrusions are provided, are symmetric with respect to a center line between both corner portions on the one end side.

2. The crystal oscillator for surface mounting according to claim 1,
wherein the mounting terminals are formed into hook shapes on adjacent sides at right angles on the four corner portions of the opening end face that is the outer bottom face.

\* \* \* \* \*